(12) United States Patent
Bailey et al.

(10) Patent No.: US 8,151,231 B2
(45) Date of Patent: Apr. 3, 2012

(54) ANALYZING INTEGRATED CIRCUIT OPERATIONS

(75) Inventors: Robert L. Bailey, Watsonville, CA (US); Brian D. Howard, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/543,099

(22) Filed: Aug. 18, 2009

(65) Prior Publication Data

US 2010/0045643 A1 Feb. 25, 2010

Related U.S. Application Data

(62) Division of application No. 11/165,862, filed on Jun. 23, 2005, now Pat. No. 7,577,930.

(51) Int. Cl.
*G06F 9/455* (2006.01)
*G06F 17/50* (2006.01)
*G06F 3/038* (2006.01)
*G09G 5/00* (2006.01)

(52) U.S. Cl. ......... 716/113; 716/134; 345/208; 345/213
(58) Field of Classification Search .............. 716/6, 136, 716/113, 134; 345/208, 213
See application file for complete search history.

(56) References Cited

U.S. PATENT DOCUMENTS

| 6,785,873 | B1 | 8/2004 | Tseng | |
|---|---|---|---|---|
| 7,577,930 | B2 | 8/2009 | Bailey | |
| 2003/0135834 | A1* | 7/2003 | Tojima et al. | 716/10 |
| 2005/0028035 | A1* | 2/2005 | Chadha et al. | 714/30 |
| 2006/0230373 | A1* | 10/2006 | Dirks et al. | 716/6 |

* cited by examiner

*Primary Examiner* — Suresh Memula
(74) *Attorney, Agent, or Firm* — Dorsey & Whitney LLP

(57) ABSTRACT

A method and apparatus for viewing and/or analyzing the operations and logical states of an integrated circuit. The logical state of various flip-flops within the ASIC may be determined at a specified time. The embodiment may store these flip-flop states in a computer-readable data structure, such as a file or database. By repeating this process and incrementing or decrementing the time with each repetition, a more complete picture of the ASIC's operation may be captured. Additionally, the embodiment may graphically display the flip-flop states, for example as a graph or waveform.

8 Claims, 6 Drawing Sheets logic block in normal functional mode logic block in scan mode graphical display

ANALYZING INTEGRATED CIRCUIT OPERATIONS

CROSS-REFERENCE TO RELATED APPLICATIONS

This application is a divisional patent application of U.S. patent application Ser. No. 11/165,862, filed Jun. 23, 2005 and entitled "Method and Apparatus for Analyzing Integrated Circuit Operations," the disclosure of which is hereby incorporated herein in its entirety.

BACKGROUND

1. Technical Field

This invention relates generally to computer hardware analysis, and more specifically to determining the state of all flip-flops in an application-specific integrated circuit and displaying an analysis based on the states.

2. Discussion of Background Art

With the advent of the computer age, integrated circuits have spread into a variety of products and applications. Not just computers, but appliances, automobiles, toys, games, and many other products contain integrated circuitry. Further, as society demands ever-more sophisticated products, integrated circuits become increasingly complex. Most integrated circuits consist of multiple logic blocks, each of which performs a logical function. Outputs from one logic block may be used to control another logic block, for example.

As with many systems, increases in the complexity of circuitry lead not only to more demanding designs, smaller form-factors, and increased costs, but also to increased failure rates and likelihood of failure. Modern integrated circuits often suffer unexpected failures due to unforeseen logic issues, parasitic impedances, crosstalk between components, synchronization errors, faulty components, overheating, and so forth. Many times, determining the exact reason for an integrated circuit's failure is extremely difficult, expensive, and time-consuming.

With the increasing miniaturization of integrated circuits, necessary to fit integrated circuits in ever-smaller footprints, larger numbers of logic blocks are fitted in each circuit. This, in turn, limits the ability to view the internal state of complex logic blocks. As the number of gates per pin and integration of high-speed analog interfaces continues to develop and limit the number of pins available to connect a debugging device to the integrated circuit, the ability to view a circuit's internal functions will continue to diminish.

Presently, certain techniques permit one to stop an integrated circuit's internal clocks and scan out the state of all flip-flops in a circuit or component logic block. However, while this may provide the ability to view a single "snapshot" of an integrated circuit's operational state, it provides no information of any time prior to or following the snapshot. Essentially, this operation permits one to determine a current state, but not earlier-occurring causes. As an analogy, present methods are similar to looking at a street sign when lost, but not consulting a map to determine what wrong turns were taken.

Generally, the prior causes of aberrant behavior may be particularly difficult to track down, especially if the exact time of the aberration is unknown. Thus, simply viewing a single snapshot of a circuit's error state may be minimally useful in many situations. It may often be preferable to view a data flow instead of a static image.

Further, it is often advantageous to view flip-flop states during the operation of an integrated circuit. Environmental variables, such as power supply and ambient temperature, may affect the operation of an integrated circuit or component logic block. Thus, errors in operation may be present when the integrated circuit is in an operating environment (such as a computer), but not a testing environment. Many current analysis routines require the integrated circuit to be removed from an operational environment.

Additionally, it is often useful to view the operation of an integrated circuit or component logic block while the integrated circuit operates at speed. The ability to view an accurate waveform during standard operation of the circuit may show, for example, errors resulting from timing or crosstalk, both of which may build over time until a fault state is reached. Presently, certain nodes within a logic block may be made visible by routing the nodes to pins external to the logic block and invoking a test mode. While this may provide good visibility of the selected nodes' operation, the method is inherently limited in the number of nodes that may be viewed. Because each node (or flip-flop) must be hardwired to a pin, the number of viewable nodes is limited by the number of available pins. Further, the decision must be made during design as to which nodes will be connected to pins, and thus viewable. Where few pins are available, the insight into the operation of a complex circuit is relatively negligible. However, if too many pins are provided, the circuit's footprint may become too large.

Thus, there is a need in the art for an improved method and apparatus for analyzing the operation of an integrated circuit.

BRIEF SUMMARY OF THE INVENTION

One embodiment of the present invention takes the form of a method for analyzing the operations and logical states of an integrated circuit. The methods and apparatuses disclosed herein may be used with a variety of integrated circuits, such as an application-specific integrated circuit (ASIC). The embodiment may be connected to the ASIC in such a manner as to permit the logical state of various flip-flops within the ASIC to be determined. The embodiment may store these flip-flop states in a computer-readable data structure, such as a file or database. Additionally, the embodiment may graphically display the flip-flop states, for example as a graph or waveform. It should be noted the flip-flops analyzed and displayed by the embodiment may be any within the integrated circuit and designated by the user of the embodiment.

Another embodiment of the present invention takes the form of a method for viewing the operations of an integrated circuit, including the operations of a) reaching a trigger event occurring at a trigger time, b) waiting a number of clock cycles after the occurrence of the trigger event, c) reading a state of a last flip-flop of a set of flip-flops in a chain, and d) determining an additional read of the state of the last flip-flop is to be performed. The method may also include the operation of incrementing a state from a next-to-last flip-flop in the chain to the last flip-flop in the chain. In some embodiments, the operation of incrementing a state may be defined as discarding the state of the last flip-flop and passing the state of the next-to-last flip-flop to the last flip-flop. The method may further include the operation of, in response to determining an additional read of the state of the last flip-flop is to be performed, performing operations a), b), c), and d) again. Similarly, the method may execute the operations of, in response to determining no additional read of the state of the last-flip flop is to be performed, storing as data every state of the last flip-flop since a first read of the state of the last flip-flop, and linking each state of the last flip-flop stored as data to a unique one of the set of flip-flops in the chain.

Certain embodiments of the invention may iterate one or more of the operations immediately set forth. These embodiments may collect state data from a variety of flip-flops within an integrated circuit or logic block, and store the state data collected during each iteration. Each set of state data generally shows the status of the flip-flops at a discrete time. When the states of each flip-flop are stored, they may be linked to an indicator of which flip-flop produced the state, such as the hierarchical name of the flip-flop. The data may be stored, for example, in a waveform database.

Another embodiment of the present invention takes the form of a waveform database, including a first set of state data comprising a first set of entries, each of the first set of entries linked to a unique one of a set of flip-flops, the set of flip-flops comprising at least a portion of an integrated circuit; a second set of state data comprising a second set of entries, each of the second set of entries linked to a unique one of a set of flip-flops; the first set of state data representing a first state of the flip-flops corresponding to a first time; the second set of state data representing a second state of the flip-flops corresponding to a second time; and the first and second sets of state data operative to form a waveform display. The waveform database may be used to create a graphical display of the flip-flop states at different times. Further, the graphical display may be non-static.

Additionally, it should be noted the various embodiments described herein may acquire state data during operation of the integrated circuit generating the state data, and while the integrated circuit remains in an operating environment such as a computing device.

Additional features and advantages of the present invention will become apparent to those of ordinary skill in the art upon reading the disclosure in its entirety.

DETAILED DESCRIPTION OF THE INVENTION

Generally, one embodiment of the present invention takes the form of a method for analyzing the operations and logical states of an integrated circuit. The methods and apparatuses disclosed herein may be used with (or at least partially within) a variety of integrated circuits, such as an application-specific integrated circuit (ASIC). The embodiment may be connected to the ASIC in such a manner as to permit the logical state of various flip-lops within the ASIC to be determined. The embodiment may store these flip-flop states in a computer-readable data structure, such as a file or database. Additionally, the embodiment may graphically display the flip-flop states, for example as a graph or waveform. It should be noted the flip-flops analyzed and displayed by the embodiment may be any within the integrated circuit and designated by the user of the embodiment. It should further be noted that embodiments of the present invention may be partially or wholly incorporated into an integrated circuit.

The embodiment may read the status of the flip-flops at different clock cycles of the ASIC. For example, the embodiment may determine the flip-flops' states for each of twenty consecutive cycles. When the embodiment collects ASIC state data for a number of consecutive cycles, it may create a visual display of the unique state data for each cycle. Further, the visual displays for each cycle may be sequenced as individual frames and shown one after another in sequential order. In this manner, the embodiment may provide an animated display of various flip-flop states, showing changes on a per-cycle basis. Alternately, the embodiment may create a display showing the states of various flip-flops across a number of cycles. The cycles shown in the display may increment, causing the flip-flop states to also increment. This may create a display where the time axis constantly shifts, causing the waveform to appear to ripple as the flip-flop states cascade with the time axis. Both exemplary displays are examples of non-static displays.

Certain embodiments of the present invention may also compare the status of each flip-flop to an anticipated or predetermined status, and indicate which flip-flops' actual states do not match the anticipated states.

In the above manners, the apparatuses and methods described herein may facilitate troubleshooting various integrated circuits.

Figure 1:
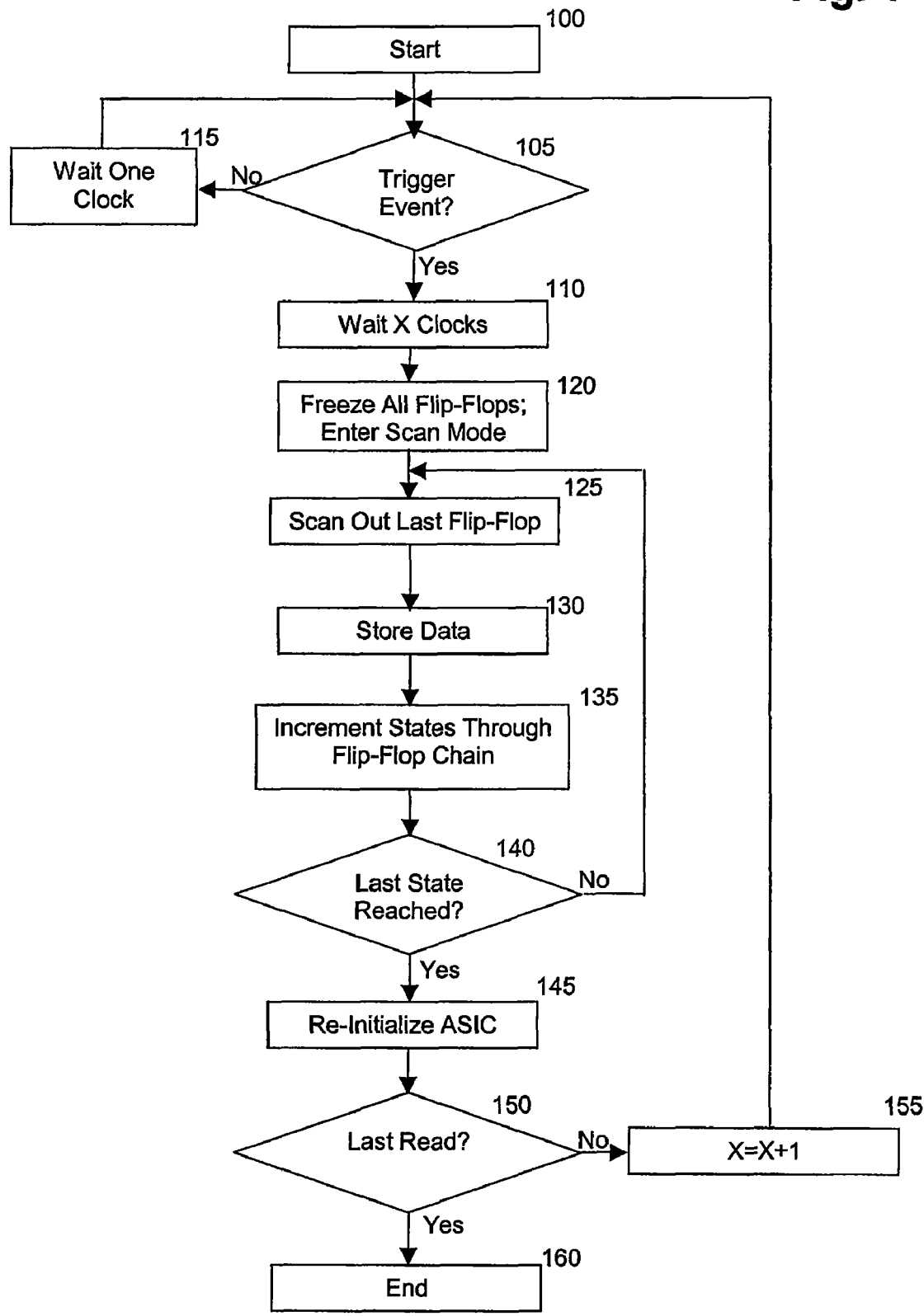
FIG. 1 is a flowchart depicting a general method of operation for an embodiment of the present invention.

FIG. 1 is a flowchart generally depicting a method of operation implemented in one embodiment of the present invention. The method of operation begins at operation 100, in which the embodiment starts the procedure. In operation 105, the embodiment determines whether a specific trigger event has been reached during the operation of the integrated circuit. The trigger event may be, for example, a specific number of clock cycles passing, a particular state of a group of flip-flops (or even a single flip-flop), a state change for a flip-flop or other element, a designated input or output, and so forth. The trigger event could be a fault or error condition, or even a certain period of time before a fault or error condition is known to be reached. That is, if an integrated circuit generally fails or produces an error after a given time from the beginning of its operation, the trigger event may occur several clock cycles prior to the typical time of failure.

If the trigger event is reached in operation 105, then operation 110 is entered. Otherwise, the embodiment waits one clock cycle in operation 115 and then returns to operation 105 to again determine whether the trigger event has been reached.

In certain embodiments, operations 105 and 115 may be replaced by a single operation in which the embodiment merely waits for a trigger event to occur. In such embodiments, once the trigger event is reached, the embodiment executes operation 110.

In operation 110, the embodiment waits a predetermined number of clock cycles (expressed in FIG. 1 as "X" clocks). The number of clock cycles in the wait delay may be preselected by a user of the embodiment, determined by the embodiment itself based on other factors (for example, preprogrammed into the embodiment), or chosen on the fly. As an example of choosing the number of clock cycles on the fly, the user may indicate with an input device, such as a keyboard or mouse, when the wait period is complete. In embodiments where the trigger event is based off a later-occurring event, such as a circuit or flip-flop failure, the wait state of operation 110 may be similarly determined. It should be noted that the wait delay may be zero.

After the passage of the wait period in operation 110, the embodiment may freeze the state of all flip-flops in operation 120. The manner in which the flip-flop states are frozen is discussed in greater detail below. By freezing the flip-flops, the state of the integrated circuit at the termination of the wait period is indefinitely preserved.

In operation 125, the embodiment reads the frozen state of at least one flip-flop.

Additionally, it should be noted that certain embodiments of the invention read the states of the flip-flops in a sequential manner. Thus, in a circuit having 128 flip-flops of interest, the state of flip-flop #128 (the final flip-flop in the chain of interest, and the flip-flop connected directly to the embodiment as described below) is read first. The state of each flip-flop is then passed to the next flip-flop in the chain. Accordingly, flip-flop #2 assumes the state of flip-flop #1, flip-flop #3 assumes the state of flip-flop #2, and so forth until flip-flop #128 assumes the state of flip-flop #127. Flip-flop #128's state may be safely discarded, because it has already been read by the embodiment. Thus, the embodiments employing a sequential read method need only actually read the state of the final flip-flop in the chain, insofar as the final flip-flop ultimately assumes the states of every prior flip-flop during the chain's incrementation. Complete incrementation of the chain may be referred to as a "scan out" of the chain.

Typically, this readout is performed sequentially on a select number of flip-flops, such as 64 or 128 flip-flops, rather than on every element of the integrated circuit. Where less than every flip-flop is read, the user may predetermine (or again, determine on the fly) which flip-flops should have their states read out. As used herein, a "chain" of flip-flops refers to a series of flip-flops (such as the aforementioned 64 or 128 flip-flops) being read. A standard ASIC may have many chains, and any number of chains may be read, or all chains may be read. Exemplary chains within an ASIC may be of any length and many such chains include thousands of flip-flops. Additionally, the present embodiment permits selection of specific chains from within an integrated circuit.

Once the state of all flip-flops of interest are read, these states are stored as computer-readable data in operation 130. Data may be stored, for example, in a computer memory, on a magnetic medium, an optical medium, or other medium known to those skilled in the art. In alternative embodiments, the state of each flip-flop may be individually stored after being read. Thus, a unique data file may exist for each flip-flop read during every iteration of the method shown in FIG. 1, a single data file may store the state of all flip-flops from a single read of the integrated circuit's state, or a combination thereof may be employed. It should be understood that the data may be stored in a computer's memory as "state data," either random-access or read-only, rather than written to a storage device such as a magnetic or optical drive.

In any of the various storage methods disclosed herein, the embodiment may read out the states of all flip-flops from the integrated circuit before storing any data outside a computer memory, or may store each state as data in a long-term storage before reading the next state. Accordingly, although FIG. 1 depicts a method in which each flip-flop state is stored before the next is read, alternative embodiments may place operation 130 after operation 140 and store all flip-flop states simultaneously. Similarly, operation 135 may be performed only in the event that the embodiment determines the last state is not reached in operation 140. In such an embodiment, operation 135 would not occur before operation 140, and would only occur in the event of a negative determination in operation 140 and before operation 125 is again accessed.

Following the storage of the flip-flop states, the states are incremented through the flip-flop chain in operation 135. This incrementing is described above. Essentially, the state of each flip-flop is moved along the chain to the next flip-flop and the final flip-flop's state discarded.

In operation 140, the embodiment determines whether the last flip-flop state in the chain has been reached. If so, operation 145 is accessed. Otherwise, the embodiment returns to operation 125 to continue the reading and storage process.

In the event that all flip-flop states have been read from the integrated circuit and stored, in operation 145 the integrated circuit is re-initialized. This may be done, for example, by resetting the entire system containing the integrated circuit. This effectively restarts all clocks within the integrated circuit and returns the flip-flops to their initial state. After re-initializing the circuit, the embodiment executes operation 150.

In operation 150, the embodiment determines whether the read and storage of flip-flop states is the final cycle of reading and storing. A user may, for example and as briefly mentioned earlier, employ the embodiment to read the flip-flop states multiple times at different times after the trigger event. Alternatively, the embodiment may be configured to default to such a state. Regardless, if the embodiment determines the present execution of operations 105 through 145 is the final execution (i.e., the series of scan outs is complete), operation 160 is accessed and the embodiment ceases operation. Otherwise, the embodiment executes operation 155.

Yet other embodiments may perform operation 145 only after operation 150, in the event that the last read has not been reached. In such an embodiment, operation 145 may be performed either prior to or after operation 155.

It should be noted that certain embodiments may omit operations 150 and 155, instead forcing the user to manually execute the method of FIG. 1 (or other methods described herein) every time a user wishes to read out the states of the flip-flops.

In the event the embodiment determines an additional incrementing of the clock cycle and read of flip-flop states is required, operation 155 is executed. In operation 155, the wait delay X is increased by 1, such that X=X+1. Alternative embodiments may decrement the wait delay by 1, such that X=X−1. Following operation 155, the embodiment returns to operation 105 and again waits for the trigger event.

Figure 7:
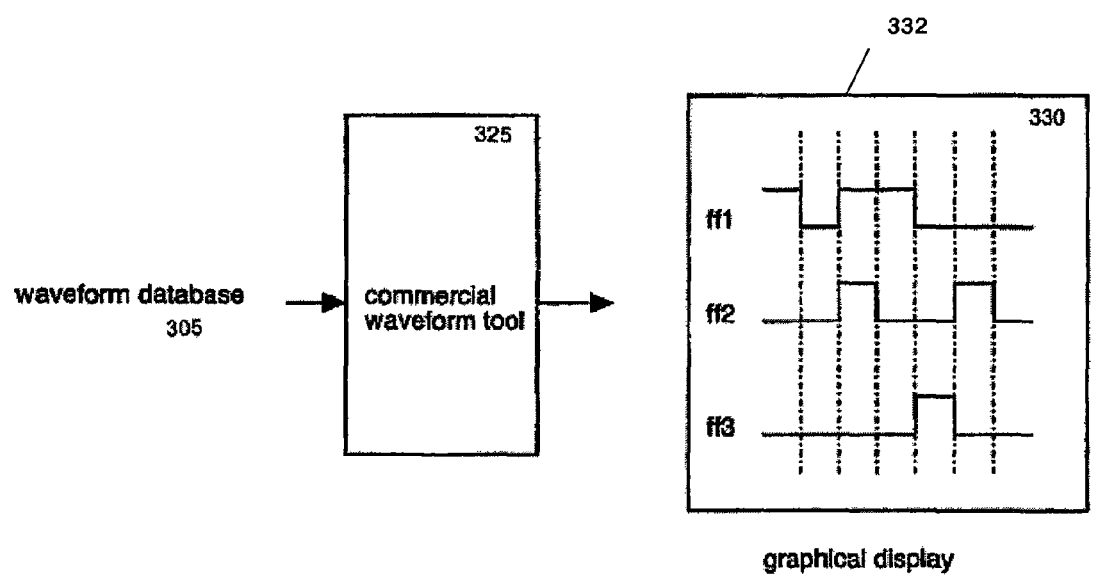
FIG. 7 depicts a graphical output of the embodiment operating in conjunction with a waveform tool.

The embodiment may further employ the stored data corresponding to each of the flip-flop cycles to construct a graphical representation. Typically, each graphical representation takes the form of a waveform graph showing the states (on or off) for each unique flip-flop. Further, when the embodiment determines and stores state data for multiple clock cycles, a graphical representation of each flip-flop's state during each clock cycle may be constructed. The representation may take the form of a graph with time as a first axis and flip-flop state (typically, on or off) as a second axis. Further, the representation may display the state of multiple flip-flops simultaneously, as shown in FIG. 7.

Alternatively, the graphical representation may depict the state of one or more flip flops for a single clock cycle, and periodically update to show the state of the flip-flop(s) during the next clock cycle. Thus, an animation may be created to depict the changing state of one or more flip-flops during operation of the integrated circuit.

Effectively, a single iteration of operations 100-145 may provide a single view of an integrated circuit's operational state, analogous to a still image of a video. Performing the entire, iterated method of FIG. 1 provides multiple still images, which taken together provide a time-varying "movie" of the circuit's state. Additionally, it should be noted that the method of FIG. 1 does not require the removal of the integrated circuit (or associated component) from an operational environment, or stopping the circuit prior to stopping the clocks. Effectively, the method of FIG. 1 may be started while the circuit is operational, and may provide a view of the operation of an integrated circuit in a system environment which was operating at full speed prior to reaching X clock cycles after the trigger event.

Having described the general method of operation, the embodiment 200 itself, as well as its operating environment, will now be discussed in more detail with respect to FIGS. 2-7. Although the embodiment 200 may be applied to a variety of integrated circuits, particular reference will be made herein to an ASIC 205. It should be understood, however, that the apparatuses and methods disclosed are equally applicable to a variety of circuits.

Generally, an ASIC 205 includes a number of logic blocks 210. Each logic block, in turn contains a number of logical elements 220 and one or more nodes or flip-flops 215, each of which change state according to the ASIC 205's internal logic. The ASIC's logical elements or sequences typically operate on one or more flip-flops. The operation of the logic determines the state of the nodes, and thus the output of the ASIC. Essentially, the logical elements may be thought of as inputs that assist in determining the state of the associated flip-flop(s) 215. As used herein, a "logic" 220 refers to one or more logical computing elements that may produce an output, and is intended to embrace any and all logical elements known to those of ordinary skill in the art, including but not limited to Boolean logical elements. The definition of "logic" also includes analog elements, such as amplifiers, comparators, capacitors, and so forth. Accordingly, a trigger event embraces analog and digital events.

Figure 2:
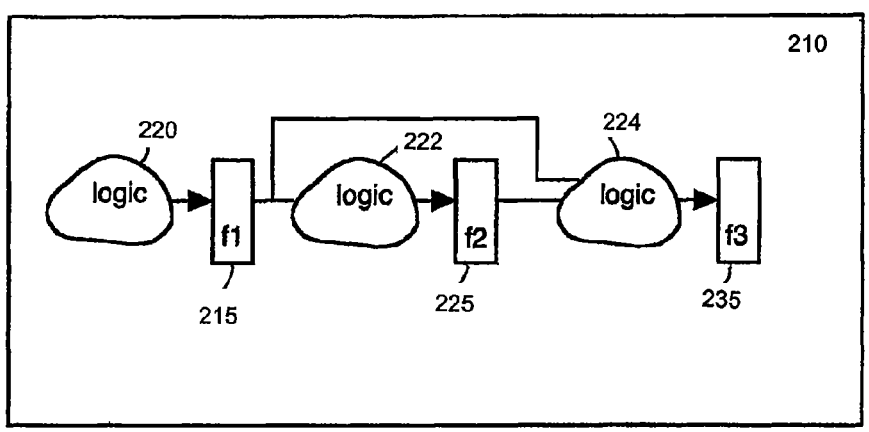
FIG. 2 depicts an exemplary logic block of an integrated circuit in an operational mode.

For example, in the logic block 210 of FIG. 2, a first logic 220 operates as an input for a first flip-flop f1 215. As the first logic changes, so too may the state of the first flip-flop f1 change. The output of the first flip-flop f1 2115 is an input into the second logic 222, which in turn serves as an input for the second flip-flop f2 225. Thus, the state of flip-flop f2 225 may be dependent on the state of flip-flop f1 115, insofar as the output of the second logic may vary with flip-flop f1's state. Similarly, the outputs of both the first and second flip-flops are inputs into the third logic 224, which is an input for the third flip-flop f3 235. Thus, as can be seen from FIG. 2, the operation of the flip-flops is not necessarily sequential (for example, the third flip-flop 235 indirectly employs the first and second flip-flops 215, 225 as possible inputs by operation of the third logic), and each flip-flop's state may vary according to the operation of the digital (and, in some implementations, analog) logics 220, 222, 224 acting as flip-flop inputs. It should be understood that the ASIC 205 implemented in FIG. 2 is not only vastly simplified, in that most ASICs contain a much larger number of flip-flops, but also exemplary in nature. The exact connection of the various logical elements and flip-flops is intended as exemplary, rather than limiting, insofar as different ASICs typically have different logical connections.

Figure 3:
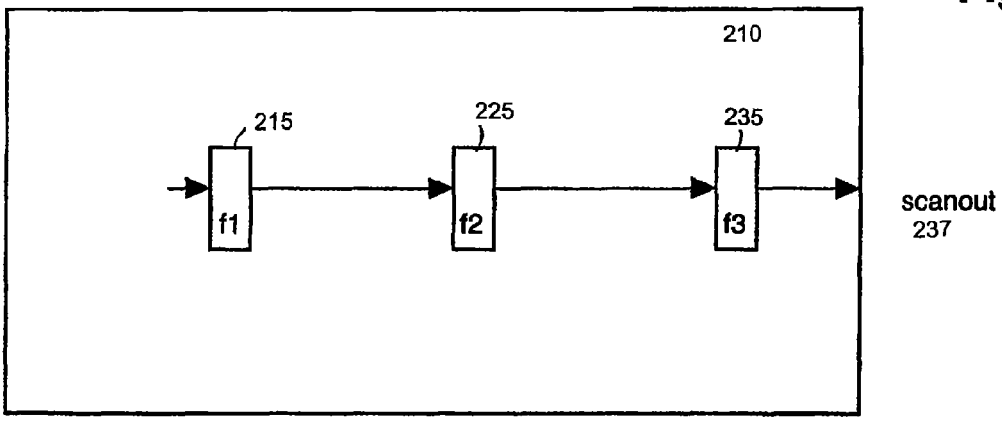
FIG. 3 depicts the exemplary logic block of FIG. 2 in a scan mode.

By contrast, FIG. 3 depicts the logic block 210 of FIG. 2 when the ASIC 205 is in a so-called "scan mode." Many ASICs (and many integrated circuits) include a scan mode as part of their functionality. Typically, in a scan mode, the ASIC 205 bypasses the various logics 220, 222, 224, instead having each flip-flop 215, 225, 235 report its state to the next flip-flop, which assumes that state in response to either an internally- or externally-generated signal. This is referred to herein as "incrementing" the flip-flops. Incrementing may occur in response to an external signal from the embodiment 200 or a clock pulse from the ASIC itself, as two examples. A "scan out" of the chain refers to incrementing the chain enough times to read the state data of all flip-flops in the chain.

To provide a more detailed example, and still with respect to FIG. 3, presume the ASIC 205 enters a scan mode in response to a signal generated by an externally-connected embodiment of the present invention. (The embodiment 200 may be connected to the "scanout," permitting it to read the state of at least flip-flop f3). When the ASIC 205 first enters the scan mode, it stops at least one, and often all, internal clocks. It should be noted that most integrated circuits include multiple internal clocks, each of which control timing for a variety of circuit elements. Ideally, the trigger event, wait delay, and flip-flops 215 of interest should all be controlled by the same clock during operation of the circuit. By placing all such elements on the same clock, exact representations of all internal signals for that clock domain may be obtained. Although the embodiment 200 may stop all of the ASIC's internal clocks, each clock may be slightly out of phase with other clocks due to delays in propagating the stop command through the ASIC 205 after the trigger event is reached. In such a situation, some or all of the flip-flops controlled by clocks other than the one linked to the trigger event may have sufficient time to change state with the next clock cycle, creating an inaccurate view of those flip-flops' states. This may be referred to as "state bleed."

Accordingly, it may be advantageous to read out the status only of flip-flops 215 having as an input the clock on which the trigger event occurs (the "trigger clock"). Flip-flops 215 operationally connected to the trigger clock will freeze their states when the trigger clock stops, thus preventing state bleed from occurring.

Returning to the example of FIG. 3, once the trigger event is reached (and any wait delay passes), the clock stopped, and the ASIC 205 enters scan mode, the flip-flops f1 215, f2 225, and f3 235 all stop. Each flip-flop maintains its state as of the time the clock stops.

The embodiment 200 may be operationally connected to the ASIC 205 through a port, such as the scanout port 237 shown on FIG. 3. Through this port, the embodiment 200 may determine and record the state of any flip-flop 215 operationally connected to the port. In the example of FIG. 3, the state of flip-flop f3 235 may be determined by an embodiment connected to the scanout port, but not the state of flip-flops f1 215 or f2 225.

Once the embodiment 200 determines the state of flip-flop f3 235, the embodiment may provide a signal to the ASIC 205 indicating the flip-flops 215 should be incremented. Alternatively, the ASIC may internally increment the flip-flops without prompting from an external dedicated signal. For example, the ASIC 205 may detect the reading of flip-flop f3's state, and, in response, increment the flip-flops. As yet another example, the ASIC may be preprogrammed to increment the flip-flops 215 after a set time passes.

After incrementing the flip-flops, flip-flop f3 235 assumes the state of flip-flop f2, flip-flop f2 225 assumes the state of flip-flop f1, and flip-flop f1 215 assumes a zero state. The embodiment 200 is typically instructed to read the state of a set number of flip-flops within a chain. This set number may be less than the total number of flip-flops 215 in the chain, and the flip-flops of interest may occur at any point in the chain. Once this set number is reached, the embodiment 200 stops instructing the ASIC 205 to increment the flip-flops and stops reading the state of the flip-flops.

Thus, it can be seen that the embodiment 200, in this example, only actually reads the state of flip-flop f3 235. Flip-flop f3, through the incrementing process described above, sequentially assumes the state of every flip-flop 215 in the chain. Accordingly, the embodiment 200 sequentially receives the state of each flip-flop in the chain through the scanout port.

Figure 4:
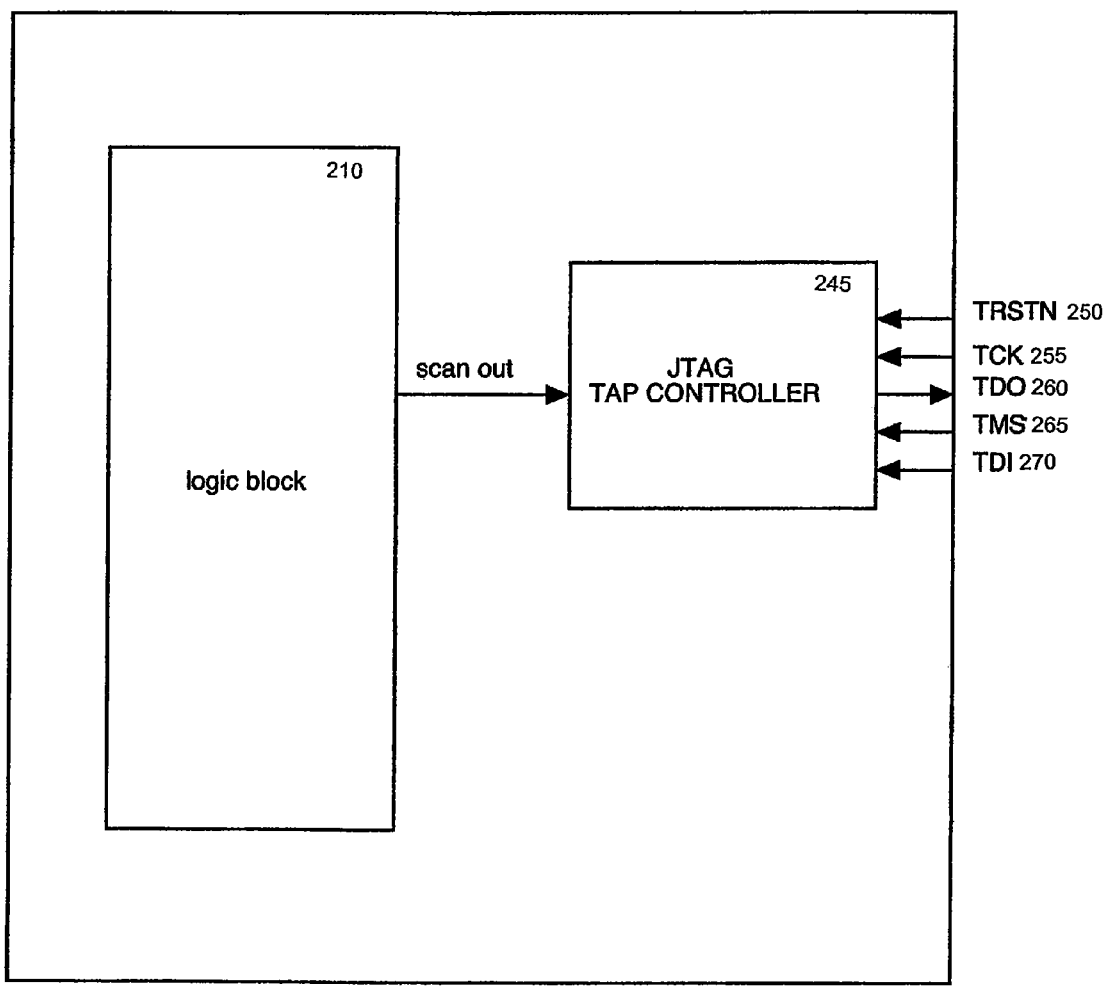
FIG. 4 depicts an exemplary integrated circuit.

FIG. 4 depicts an exemplary ASIC 205. The ASIC includes a logic block 210, which contains the various logic elements 220 and flip-flops 215 that perform the logical operations of the ASIC. The logic block 210 is operatively connected to a controller 245, which manages the scanning and reading of the states of the various logic elements (including flip-flops). The controller 245 may have multiple input and output connections, permitting it to interface with an appropriate hardware element outside the ASIC 205. In the example of FIG. 4, the controller is a JTAG controller.

A JTAG controller 245 is a controller conforming to the standards of the Joint Test Action Group. This standard generally specifies how to control and monitor the pins of compliant devices on a printed circuit board, such as the ASIC 205. Each controller 245 has five control lines: a common reset (TRSTN) 250; clock (TCK) 255; data out (TDO) 260; data in (TDI) 270; and a mode select input line (TMS) 265. Generally speaking, the JTAG controller is well known in the art and included as a standard feature on many integrated circuits. The JTAG controller is not typically active during operation of the ASIC 205 or circuit. The JTAG controller 245 is described in more detail in the Institute of Electrical and Electronics Engineers, Inc.'s publication no. IEEE P1149-1990, which is incorporated herein. Commands may be issued and data received across the control lines by the embodiment 200, as known to those skilled in the art.

It should be understood that the present invention, although described using a JTAG controller 245 implemented in an integrated circuit as an invention, embraces a variety of outputs and control schemes. Any output from an integrated circuit permitting reading of the states of various nodes within the circuit is intended to be embraced by the present invention.

Figure 5:
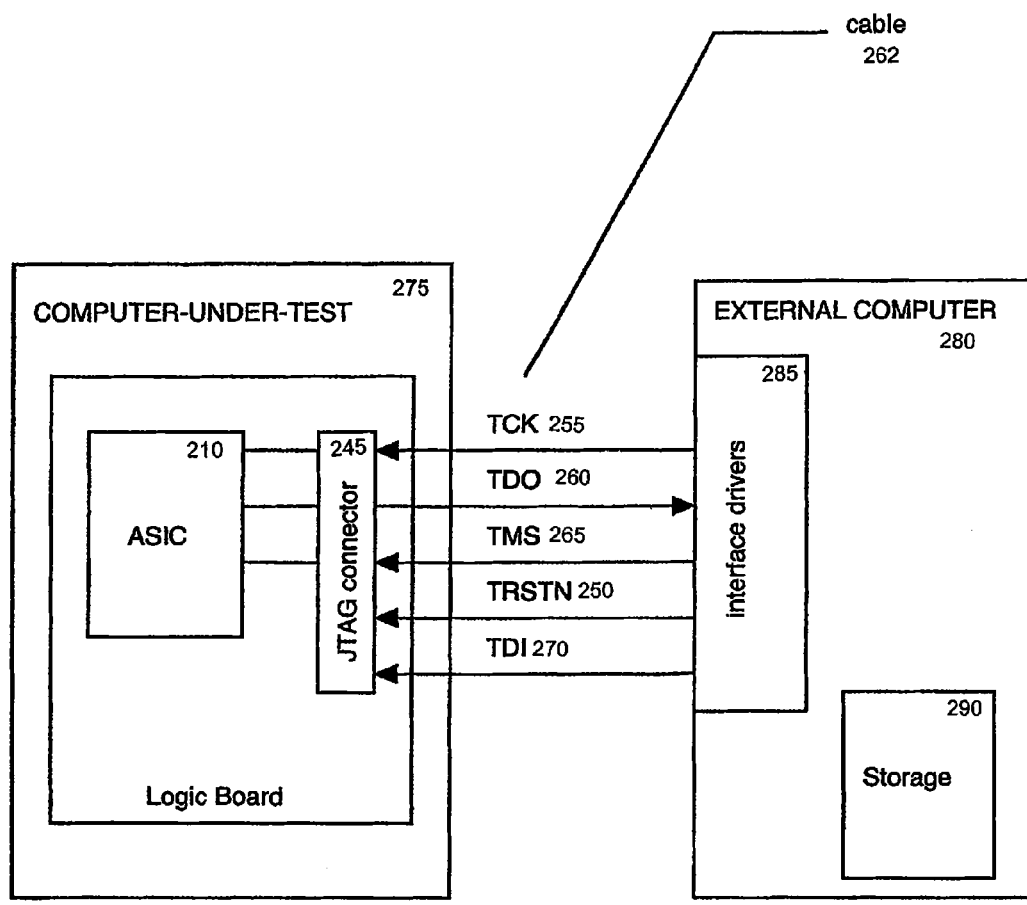
FIG. 5 depicts the embodiment interfacing with the integrated circuit of FIG. 4

FIG. 5 generally depicts the present embodiment 200 as a computing system connected to a test computer. The test computer includes an integrated circuit board, on which the ASIC 205 being tested resides. The ASIC, in turn, is connected as described above to a JTAG connector on the logic board. The embodiment 200 may operationally connect to the JTAG connector to read the various flip-flop states. The embodiment 200 typically includes an interface driver 285 (i.e., software) and/or interface hardware configured to communicate with the JTAG connector, to transmit and receive data. (Alternative embodiments may use both hardware and software, such as a dedicated board and related driver, as an interface with the integrated circuit.) Received data may include the state of the flip-flops, while transmitted data may include incrementing and other control commands. Typically, a cable 262 connects the embodiment's interface to the JTAG connector.

As state data for the various flip-flops is read from the ASIC 205, through the connector and cable, and into the embodiment 200 via the interface, it may be stored on a storage medium by a storage device 290. Exemplary storage devices 290 include, but are not limited to, hard drives, disk drives, compact disk drives, digital versatile disk drives, volatile and non-volatile memory, and other magnetic and/or optical drives as known to those skilled in the art.

Typically, the state data is stored as one or more data files 295. Each data file corresponds to a clock cycle, and is typically associated with that clock cycle by time-stamping or otherwise marking the data file. Multiple files 295 may be associated with a single clock cycle. This may occur when, for example, each flip-flop 215 state is stored in a separate file, or where the embodiment 200 reads a first set of flip-flops associated with a first clock, then reads a second, different set of flip-flops 215 associated with a second clock. The two sets of flip-flops may be associated with a single timestamp, especially where both sets of flip-flops are later incremented and additional state data read.

Figure 6:
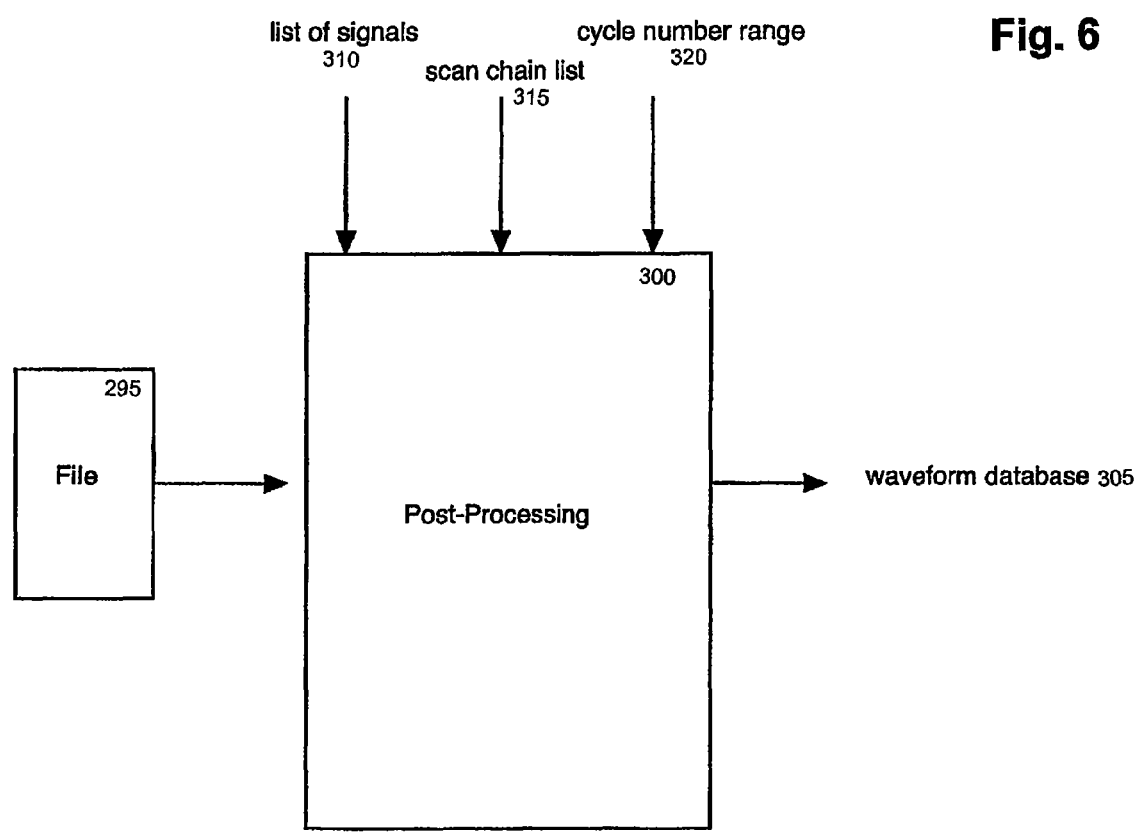
FIG. 6 depicts a post-processing aspect of the embodiment.

As shown in FIG. 6, the data file or files 295 may be post-processed to create a waveform database 300. Post-processing generally takes the state data, a listing of the flip-flops 215 showing the order in which the flip-flops were read out of the ASIC 205 (a "scan chain list" 315), a designation of which flip-flops should be mapped to the waveform database (a "list of signals" 305), and a designation of a specific timeframe that should be encompassed by the waveform database (a "cycle range" 320). The scan chain list and cycle range may be automated, or may be user-specified. The list of signals not only designates which flip-flops' state data should be included in the waveform database, but also provides the hierarchical name of each flip-flop 215. A post-processing module 300, whether software or hardware, typically includes a hierarchical map of the ASIC 205, which models the linkage of each flip-flop to the relevant logic elements 220 (including other flip-flops). Thus, when the post-processing module receives the hierarchical name of each flip-flop 215, tied to the flip-flop's output, it may accurately map the flip-flop states to the proper hierarchical location within the ASIC. Further, in some embodiments, the post-processing module may be sufficiently sophisticated to model the behavior of the ASIC 205 and thus generate expected values for each flip-flop of interest during a clock cycle of interest. Such embodiments may then compare state data for each of the flip-flops of interest during the clock cycles of interest to the expected values, and flag any deviations. These deviations, along with data identifying the flip-flop and clock cycle of deviation, may then be presented to the user.

Given these inputs, the post-processing module 300 may prepare a waveform database 305 storing the states of each flip-flop of interest during all clock cycles of interest (the "interest interval"). Each flip-flop's states, strung together across the interest interval, constitute a separate waveform within the waveform database 305.

The waveform database 305 may be accessed by a commercially-available waveform generation tool 325 to create a graphical display of the various flip-flop state waveforms 330 for display on a display device 332, as shown in FIG. 7. Various commercially-available waveform generation tools 325 are known to those skilled in the art, and accordingly are not discussed further herein. It should be noted that certain waveform generation tools may only accept data configured in a certain manner. The present embodiment 200 may, as necessary, alter the configuration of its stored waveform database 305 to match the requirements of certain waveform generation tools.

The waveforms and other graphical displays 330 created by either the present embodiment 200 or a waveform generation tool 325 acting on data created by the present embodiment 200 may prove particularly useful in determining whether a flip-flop 215 enters a faulty state during a particular clock cycle. A user may visually compare the graphical display 325 to the states of each flip-flop, presuming the integrated circuit works properly, and thus determine which flip-flop enters an incorrect state, and during which clock cycle the incorrect state occurs.

In some cases, however, a flip-flop 215 may enter an incorrect state (fail) only occasionally. Essentially, the flip-flop may fail randomly, based at least in part on fluctuations of the ASIC 205, circuit board on which the ASIC rests, power supply fluctuations, and so forth. The present embodiment 200 may facilitate tracking down such random errors.

The embodiment 200 may gather state data for the flip-flops of interest across the interest interval multiple times. For example, the embodiment 200 may gather state data during the interest interval ten times. If a flip-flop 215 has a 20% chance to fail, roughly two of the ten sets of state data should show the failure. Estimated failure rates for the ASIC 205 may be available from observation of the ASIC during operation, or other diagnostic test data. The embodiment may either graphically display all ten cycles of interest, or may compare the state data for each flip-flop to the expected or anticipated state data to determine which flip-flops fail. As yet another alternative, given the estimated failure rate, the embodiment 200 may determine which flip-flop's state data, across each of the sets, is not constant at the same clock cycle. A variation in state data between sets, at the same clock cycle, indicates a failure of the flip-flop 215. The embodiment 200 may further determine percentages for which state (on or off) is occupied during the clock cycle in question. The embodiment may then compare the "on" percentage to the failure rate, and do the same with the "off" percentage. The state corresponding to the percentage closest to the estimated failure rate is likely the fail state. Thus, to continue the above example, if a given flip-flop occupies the "on" state for three of ten sets at the same clock cycle and the "off" state for the other seven sets, the "on" state is likely the failure state for this particular flip-flop (since the flip-flop has a 20% chance to fail). Accordingly, the embodiment 200 may present the flip-flop, clock cycle, and states occupied during the clock cycle to a user for either confirmation or further testing.

Sometimes, a user may wish to determine the state date of a flip-flop 215 whose output is connected to or controls an environment control, such as power. In such a case, the environment control may be terminated or reset if the flip-flop 215 changes state. Further, the termination of the environment control may cause the ASIC 205 to reset or ASIC operations to cease, thus wiping out state data during the scan out.

In order to prevent the premature cessation of the scan out, a test mode signal may be multiplexed into the flip-flop's output connected to the environment control. The test mode signal may be taken from within the ASIC 205 or provided by the embodiment 200.

It should be noted that the embodiment 200 may select which chains to scan out. Accordingly, the embodiment may perform the methods described herein on any or all chains within an integrated circuit. For example, an integrated circuit may be designed to recognize customized commands that may be issued by an embodiment 200 for the purpose of selecting different chains. Continuing the example, the embodiment may employ a JTAG port 245 recognizing custom commands to select specific chains by issuing particular, user-definable commands to the JTAG port. In brief, these customized commands instruct the JTAG port to provide accessibility to selected chains.

Although the present embodiment 200 has been described with reference to particular methods and apparatuses, it should be understood that the present invention may be modified in a variety of manners that will occur to those of ordinary skill in the art upon reading this disclosure to create alternative embodiments. Such alternative embodiments are embraced by the spirit and scope of the invention. For example, one alternative embodiment may employ two clocks, one fixed clock representing the wait delay and a second clock that is incremented after each scan out, in place of the single clock described herein. Yet another embodiment may employ a fixed wait delay period and increment the start of each scan out, rather than incrementing the wait delay during each operation as described with respect to FIG. 1. Similarly, yet other embodiments may change the order of operations 145 and 150. Accordingly, the proper scope of the present invention is defined by the appended claims.

We claim:

1. A computer system configured to communicatively couple an integrated circuit, the computer system comprising:
   a non-transitory computer-readable medium embodying a waveform database, comprising:
      a first set of state data comprising a first set of entries, each of the first set of entries linked to a unique one of a set of flip-flops, the set of flip-flops comprising at least a portion of the integrated circuit;
      a second set of state data comprising a second set of entries, each of the second set of entries linked to the unique one of the set of flip-flops;
      the first set of state data representing a first state of the set of flip-flops corresponding to a first time and sampled from the set of flip-flops;
      the second set of state data representing a second state of the set of flip-flops corresponding to a second time and sampled from the set of flip-flops;
      such that the first and second sets of state data, when processed by a computing system, are operative to form, on a display device, a waveform display indicating time-varying states of the set of flip-flops.

2. The non-transitory computer-readable medium embodying the waveform database of claim 1, wherein the waveform display depicts the first state of the flip-flops and the second state of the flip-flops.

3. The non-transitory computer-readable medium embodying the waveform database of claim 1, wherein the waveform display is non-static.

4. The non-transitory computer-readable medium embodying the waveform database of claim 1, wherein the first and second sets of state data are operative to be inputted to a waveform generator to generate the waveform display.

5. The non-transitory computer-readable medium embodying the waveform database of claim 1, wherein:
   the first set of state data is sampled from an integrated circuit when a clock is frozen upon reaching the first time; and
   the second set of state data is sampled from an integrated circuit when the clock is frozen upon reaching the second time; the second time different than the first time.

6. The non-transitory computer-readable medium embodying the waveform database of claim 5, wherein the second time occurs one clock cycle after the first time.

7. The non-transitory computer-readable medium embodying the waveform database of claim 5, wherein the integrated circuit is operating at the first and second time.

8. The non-transitory computer-readable medium embodying the waveform database of claim 5, wherein the second time occurs one clock cycle before the first time.

* * * * *